US005666286A

United States Patent [19]

Nojima et al.

[11] Patent Number: 5,666,286

[45] Date of Patent: Sep. 9, 1997

[54] DEVICE AND METHOD FOR IDENTIFYING A NUMBER OF INDUCTIVE LOADS IN PARALLEL

[75] Inventors: Geraldo Nojima, Duluth; Timothy P. Near, Alpharetta, both of Ga.

[73] Assignee: Nordson Corporation, Westlake, Ohio

[21] Appl. No.: 541,609

[22] Filed: Oct. 10, 1995

[51] Int. Cl.[6] .............................. H01F 7/18; G01R 27/26

[52] U.S. Cl. .................... 364/481; 364/482; 73/862.331; 73/862.626; 324/654; 324/600

[58] Field of Search .................................... 364/481, 482; 73/862.331, 862.626; 324/654, 445, 145, 600; 331/181; 222/52; 53/70; 123/499; 194/314; 251/129.15

[56] References Cited

U.S. PATENT DOCUMENTS

| | | | |
|---|---|---|---|
| 3,864,608 | 2/1975 | Normile et al. | 317/148.5 R |
| 4,045,728 | 8/1977 | Fletcher et al. | 324/59 |
| 4,173,030 | 10/1979 | Rabe | 361/154 |
| 4,258,315 | 3/1981 | Westra | 324/59 |
| 4,438,478 | 3/1984 | Matsuyama | 361/152 |
| 4,453,652 | 6/1984 | Merkel et al. | 222/504 |
| 4,454,466 | 6/1984 | Ritter | 323/258 |
| 4,470,095 | 9/1984 | Donig | 361/153 |
| 4,630,165 | 12/1986 | D'Onofrio | 361/154 |
| 4,890,188 | 12/1989 | Russell et al. | 361/154 |
| 5,014,012 | 5/1991 | Kuboyama et al. | 324/720 |
| 5,233,543 | 8/1993 | Hoglund et al. | 364/551.01 |
| 5,448,492 | 9/1995 | Kolomyski et al. | 364/483 |
| 5,497,322 | 3/1996 | Kolomyski et al. | 364/424.03 |
| 5,500,598 | 3/1996 | Ford | 324/547 |

FOREIGN PATENT DOCUMENTS

| | | | |
|---|---|---|---|
| 0 592804 | 4/1994 | European Pat. Off. | H01F 7/18 |

OTHER PUBLICATIONS

Qiu et al., "Numerical Calculation on Multi-Layer Solenoidal Coil", IEEE Transactions on Magnetics, vol. 29, No. 2, Mar. 1993.

Mouser Electronics, "Chokes, Ferrite beads & Inductors", Purchasing Manual 570, p. 135, 1992.

Patent Abstracts of Japan, vol. 011, No. 046 (E-479), Feb. 12, 1987.

E28 Electric Gun Driver Manual (Nordson), © 1994.

*Primary Examiner*—Emanuel T. Voeltz
*Assistant Examiner*—Patrick J. Assouad
*Attorney, Agent, or Firm*—Renner, Kenner, Greive, Bobak, Taylor & Weber

[57] ABSTRACT

A device for identifying the number of solenoids/inductive loads connected in parallel to an electric gun driver is provided. In particular, the electric gun driver, which operates a multiple number of dispensing devices with a like number of solenoids for dispensing liquid adhesive on packaging materials, determines the number of solenoids or inductive loads connected in parallel thereto for operation thereof. The device includes an input/output device, a first and a second terminal wherein any number of solenoids are connected therebetween, and a micro-controller connected to the input/output device for determining the number of solenoids connected between the first and second terminals and for supplying an operating current to control the operation of the solenoids as desired by the operator. The device also includes a switch that is toggled on by the micro-controller so that a feedback voltage and a feedback current can be sensed by the micro-controller whereupon the micro-controller determines the actual current supplied to the load and compares this value with predetermined ranges of values so as to determine the number of solenoids connected between the first and second terminals. Based upon this information, the micro-controller appropriately applies a pull-in current and a holding current to ensure the proper operation of the spray gun dispenser.

16 Claims, 2 Drawing Sheets

10
11
12
I/O
20
VNOM
42
40
21
14
16
18
18a
18b
18c
22
30
24
26
28
32
34
47
VFDBK
44
VIMPULSE
38
IFDBK
46
INITIATOR
36
PROCESSOR
48
COMPARATOR
50
MEMORY
52

DEVICE AND METHOD FOR IDENTIFYING A NUMBER OF INDUCTIVE LOADS IN PARALLEL

TECHNICAL FIELD

Generally, the present invention resides in the art of dispensing devices, sometimes known as guns, gun modules or dispensing modules, used to dispense fluids, such as liquid adhesive, sealant or caulks. More particularly, the present invention determines how many dispensing devices and associated solenoids are connected to a dispensing gun driver. Specifically, the present invention is directed toward a device for identifying the number of solenoids, and their representative parallel inductive loads, connected to the dispensing gun device so as to generate and adjust a driving current used to actuate the solenoids.

BACKGROUND ART

It is known in the packaging industry to provide dispensing devices that dispense liquid adhesive on packaging materials in spots or any other desired pattern, such as a swirl, a spray, a plurality of beads, drops or droplets. The packaging material is then folded in a predetermined manner so that the dispensed adhesive comes in contact with mating potions of the packaging material to form the desired container or package. These dispensing device are also employed to dispense adhesives on substrates, woven and non-woven, materials and products assemblies. Due to high speed nature of this assembly process, dispensing devices have been developed using electrical control systems which are also known as gun drivers.

Known dispensing devices include a valve-type system containing a plunger (also known as an armature or valve needle) received within an orifice, wherein a solenoid is employed to control the movement of the plunger from a closed position to a dispensing position and back again to a closed position, such as set forth in U.S. Pat. No. 5,375,738, the disclosure thereof is incorporated herein by reference, and which is owned by the assignee of this invention.

Gun drivers have been developed employing electric circuit controls to enhance the operation of the dispensing device. Many factors contribute to the efficient operation of such a dispensing device including, but not limited to, the viscosity of the adhesive to be applied, the heat generated by the resistance and inductance of the solenoid, the temperature of the fluid or adhesive to be applied, the desired pattern of the adhesive and the number of solenoids connected to the control device. To insure the proper operation of the dispensing device or devices, it is important that the plunger quickly open and quickly close the orifice when desired. To achieve this, it is required that the solenoid receive a fast pull-in current that quickly opens the plunger from the orifice at the beginning of the dispensing cycle, a minimal holding current which holds the plunger in an open position while minimizing the amount of heat buildup in the solenoid coil during dispensing, and a fast dissipation of current from the solenoid coil so that the plunger is quickly closed upon the orifice at the end of the dispensing cycle. U.S. Pat. No. 4,453,652, which is assigned to the assignee of this invention, describes a method of reducing the current flow through a coil once the plunger has moved to its open position.

It is presently known to supply current to multiple dispensing modules from a single current source. In order to properly control the operation of these multiple dispensing modules, it is required that an operator place switches in predetermined positions or insert or remove physical jumper connections between the solenoids so that they operate in the desired sequence. Several problems arise when the aforementioned switches or physical jumper connections are not properly implemented. For example, if not enough current is supplied to the solenoids, the required pull-in current value may not be attained so that the solenoids remain closed or are delayed in their opening. As such, the desired dispensing pattern is not obtained. It is also possible that too much current could be supplied to a solenoid so that the solenoid or plunger assembly itself is damaged, thereby causing downtime to the manufacturing process as the solenoid or dispensing device is replaced It will also be appreciated that current dispensing devices do not allow for the easy determination of whether a solenoid is operating within a predetermined current range. In other words, if after a period of time the inductor contained within the solenoid begins to degrade, there is no facile means for quickly correcting the problem.

Based upon the foregoing, it is apparent that there is a need for a device to identify the number of inductive loads or solenoids connected in parallel to a gun driver to assure that an appropriate level of current to the solenoids is attained. Moreover, there is a need in the art for a monitoring device to determine if any one of the solenoids connected to a dispensing device is operating with an unacceptable current level.

DISCLOSURE OF INVENTION

In light of the foregoing, it is a first aspect of the present invention to provide a device for identifying the number of inductive loads connected in parallel to a gun driver.

Another aspect of the present invention is to provide a device for identifying the number of inductive loads in parallel with a gun driver that has a micro-controller.

Still a further aspect of the present invention is to provide a device for identifying the number of inductive loads connected in parallel with a gun driver that has predesignated terminals for connecting any number of dispensing devices thereto.

An additional aspect of the present invention is to provide a device for identifying the number of inductive loads connected in parallel to a gun driver wherein the micro-controller supplies a voltage impulse to the predesignated terminals so that a feedback current is returned to the micro-controller for analysis.

Yet an additional aspect of the present invention is to provide a device for identifying the number of inductive loads connected in parallel to a gun driver wherein the current feedback is compared to various known ranges of current to determine the number of inductive loads connected to the dispensing device and so that the micro-controller can adjust a pull-in current and a holding current, in order to properly operate the dispensing devices.

Still another aspect of the present invention is to provide a device for identifying the number of inductive loads connected in parallel to a gun driver wherein the current supplied to the inductive loads is monitored and compared to predetermined thresholds to provide an appropriate indication thereof.

The foregoing and other aspects of the invention, which shall become apparent as the detailed description proceeds, are achieved by a device for determining the number of inductive loads connected thereto, comprising: an input/output device; a first terminal and a second terminal adapted to receive a number of inductive loads therebetween; and a micro-controller connected to the input/output device, wherein the micro-controller determines the number of inductive loads connected between the first and second terminals and controls a current received by the inductive loads.

Other aspects of the invention, which will become apparent herein, are attained by a device for quantifying and operating an unknown number of inductive loads in parallel, comprising: a first terminal and a second terminal which have connected therebetween an unknown number of solenoids; a micro-controller which controls the magnitude of an operating current supplied to one of said first and second terminals; and a transistor connected between one of the first and second terminals and the micro-controller, wherein the transistor is momentarily toggled on to allow the micro-controller to quantify the number of solenoids connected between the first and second terminals.

Still other aspects of the invention, which will become apparent herein, are attained by a method for identifying the number of parallel inductive loads connected to a dispensing gun driver circuit, comprising the steps of: providing first and second terminals for connecting any number of parallel inductive loads therebetween; supplying a nominal voltage to the first and second terminals; sensing a feedback current generated by the inductive loads; and processing the feedback current to determine the number of parallel inductive loads connected between the first and second terminals to supply the necessary operating current thereto.

BEST MODE FOR CARRYING OUT THE INVENTION

Figure 1:
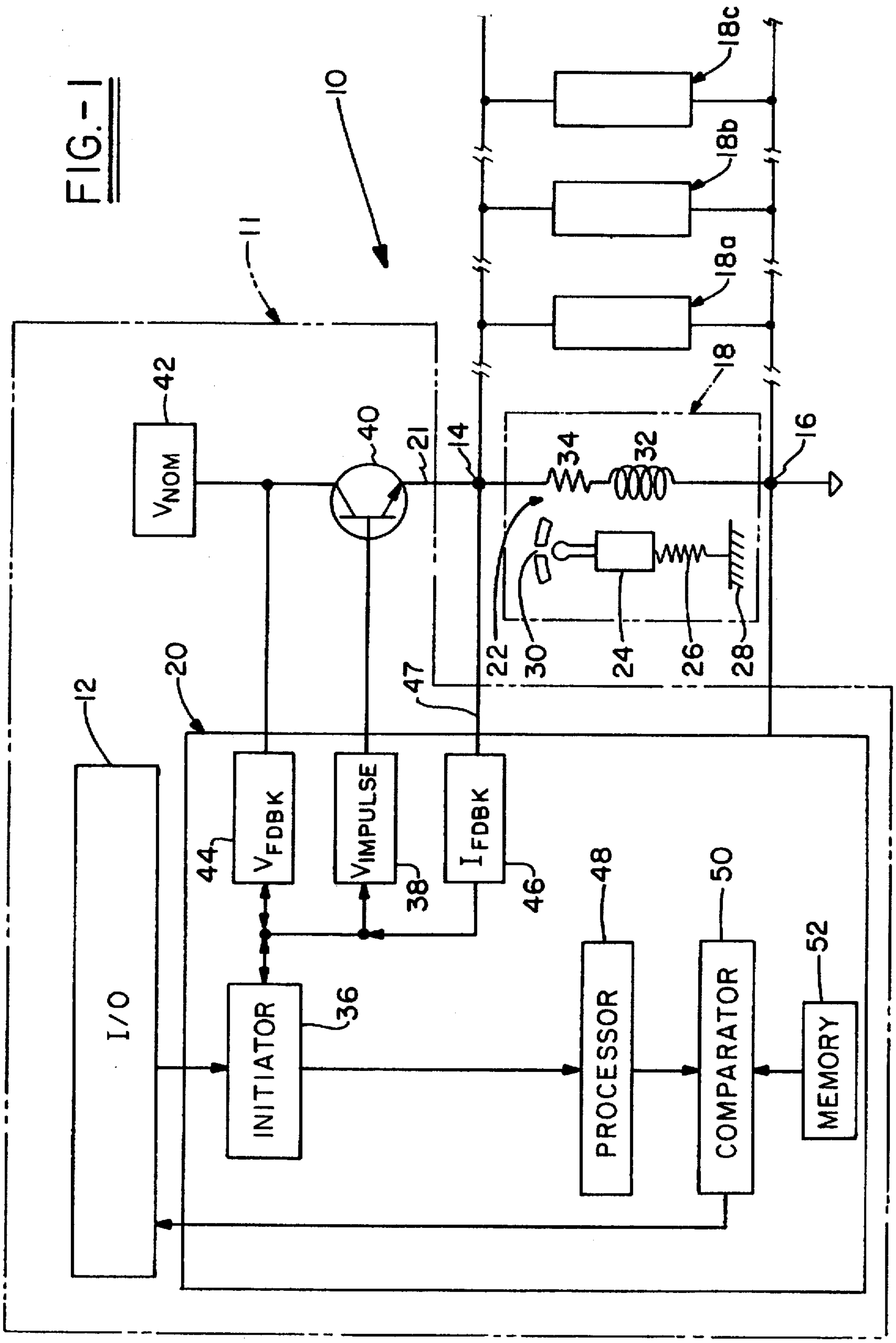
FIG. 1 is a schematic diagram of a control circuit according to the present invention.

Referring now to the drawings, and in particular FIG. 1, it can be seen that a device for identifying the number of inductive loads in parallel connected thereto is designated generally by the number 10. Generally, the device 10 includes a gun driver 11 with an input/output device 12, a first terminal 14, a second terminal 16 and a dispensing device or gun 18. It will be appreciated that any number of dispensing devices, designated as 18 with a letter suffix such as 18*a* and so on, could also be connected between the first and second terminals 14 and 16, respectively. It will also be understood that each dispensing device 18, 18*a*, 18*b*, etc., has an equivalent value of inductance. Also included in the gun driver 11 is a micro-controller 20 which is connected to the input/output device 12, wherein the micro-controller 20 determines the number of dispensing devices 18 connected between the first and second terminals 14, 16, respectively, and generates an operating current 21 which is employed to drive the dispensing devices 18. Although in the preferred embodiment the micro-controller 20 only determines whether there are 0, 1, 2, 3 or 4 dispensing devices connected to the gun driver 11, it will be appreciated that any number of like dispensing devices could be determined from an appropriate micro-controller.

In particular, it will be appreciated that for each dispensing device 18 connected between the first and second terminals 14 and 16, respectively, there is a corresponding solenoid 22. The solenoid 22 includes a movable member, such as a plunger 24 which may be biased by a spring 26 that is interposed between the movable plunger 24 and a fixed reference 28, such as the gun body. The movable plunger 24 is in an operative relationship with an orifice 30 such that when the movable plunger 24 is moved, the dispensing material contained within the dispenser 18 is permitted to flow under pressure through the orifice 30 onto the desired object. The movable plunger 24 is actuated by the application of current through the coil 33 of the solenoid 22 which has an inductance 32 and a resistance To insure the proper operation of the dispenser 18, it is imperative that the actuation of the movable plunger 24 be precisely controlled. To accomplish this, current is modulated to the solenoid 18 in various stages. In the first stage, a high level of current, commonly known as a "pull-in" current, is employed to overcome the force applied by the spring 26 and the viscosity of the material contained within the dispenser 18 to move the plunger 24 away from the orifice 30 into a dispensing position. In the second stage, a "holding current," which is appreciably less than the pull-in current, is employed to hold the movable plunger 24 in place. It is desirable to have a holding current that is reduced in value, which minimizes the amount of heat generated in the resistance 34 of the coil 33, so as to not degrade the insulation of the coil or to cause the coil to fail, while also reducing the energy necessary to drive it. In the final stage, the holding current is quickly dissipated from the solenoid 22 so as to quickly close the movable plunger 24 upon the orifice 30. These various stages of current application and removal must be precisely controlled so as to facilitate the smooth assembly line operation of the dispensing devices 18. To ensure that the proper level of operating current 21 is applied to the plurality of solenoids 22, it is imperative to apply the proper magnitude of current to the gun modules. Too much current may cause them to fail while too little may cause them not to open or to open or close late. Therefore, it is important to know the number of solenoids so that the proper amount of current is employed.

To implement the proper application of the operating current 21, the micro-controller 20 includes an initiator 36. The initiator 36 receives operator input from the input/output device 12, including but not limited to what pattern is required to be applied to the packaging materials and the temperature and viscosity of the fluid to be dispensed. Based upon the operator input, the initiator 36 generates a voltage impulse 38 which is connected to and received by the base of a transistor 40. Connected to the collector of the transistor 40 is a nominal voltage supply (Vnom) 42 which provides power to the dispensers 18 when the transistor 40 is toggled to an "on" position. Also connected to the collector of the transistor 40 is a voltage feedback sensor 44 which is contained within the micro-controller 20. The voltage feedback sensor 44 determines what the applied voltage (Vapp) is when the transistor 40 is toggled on by the voltage impulse received from generator 38. Connected to the emitter of transistor 40 is a current feedback sensor 46 which senses a feedback current 47 flowing along the operating current signal line 21 when the transistor 40 is on. It will be appreciated that the voltage feedback sensor 44 transmits a voltage feedback value to the initiator 36. Likewise, the current feedback sensor 46 transmits a current feedback value to the initiator 36.

The values collected by the initiator 36 are then sent to a processor 48. The processor 48 measures and scales the current feedback value according to a ratio of the nominal voltage supply 42 and the applied voltage sensed by the voltage feedback sensor 44 so as to generate an actual value for the operating current that is flowing through the first and second terminals 14 and 16, respectively. A comparator 50 receives the actual operating current value generated by the processor 48 and compares this value with a plurality of predetermined ranges of current values correlating to the possible number of dispensing devices 18 connected between the first and second terminals 14 and 16, respectively. Those skilled in the art will appreciate that when the actual current value fails within one of the predetermined ranges of current, comparator 50 transmits this information via line 51 to the input/output device 12. Accordingly, the input/output device 12 instructs the micro-controller 20 as to what values of pull-in current and holding current should be generated to drive the respective coil of each gun module.

It will be understood that in order to determine the number of solenoids connected between the first and second terminals 14 and 16, respectively, it is required that the theoretical steady state and transient currents of the solenoid or solenoids 22 be defined and compared to the actual measured current values determined by an identification test. The theoretical values are determined by the equations presented below.

In particular, the steady state current is defined by the following equation:

$$I=Vapp/R \quad (1)$$

where Vapp is the applied voltage magnitude in DC volts as monitored by the voltage feedback sensor 44 and where R is the solenoid resistance 34.

The transient current in a solenoid is defined by the following equation:

$$dI/dt=Vapp/L \quad (2)$$

where dI/dt is the measured slope of the current at Vapp in amps/second and where L is the solenoid inductance 32.

While the total resistance of the solenoid 22 can vary with changes in temperature, such as from the heat of the adhesive flowing through the dispenser 18 and any heat generated by the resistance 34 of the coil, it will be appreciated that the value of the inductance 32 remains basically constant.

Because the value of the inductance 32 is a known or a reference value, as dictated by the solenoid design, the value of dI can be defined as a reference, dIref. It will be appreciated that during the identification test, the value of dIref must be kept low so as to prevent the magnetic force generated in the inductance 32 from moving the movable plunger 24 from the seat to allow fluid to be dispensed from the orifice 30. It will also be appreciated that the value of dIref must be kept low enough so that the effect of resistance 34 is negligible. Additionally, solenoids 22 require the use of a nominal operating voltage 42. With the above information, direr can now be defined by the following equation:

$$dIref=(Vnom*dt)/L \quad (3)$$

where dIref is the current magnitude reference for one solenoid 22 and where dt is the voltage impulse duration to generate dIref at the nominal operating voltage 42 (Vnom). The current references for the different possible number of solenoids are determined by multiplying that number by the value of dIref. Those skilled in the art will appreciate that it is necessary to set a tolerance window or a predetermined range of current values around the reference feedback current (dIref) value due to variations in the manufacturing of the solenoids 22. These predetermined ranges are stored in memory 52.

As those skilled in the art will appreciate, the nominal voltage supply 42 (Vnom) may vary due to normal line voltage variations received from various power supplies. To compensate for these variations, a correction factor "k" can be applied to the measured feedback current value 47 in order to scale it back to the nominal voltage supply 42 from the applied voltage Vapp sensed by the voltage feedback sensor 44. This is exemplified by the following equations:

$$k=Vnom/Vapp \quad (4)$$

$$dIact=k*dI \quad (5)$$

where dI is the measured feedback current value 47 and where dIact is the corrected actual value of the current due to line voltage variations in the nominal voltage supply 42. The actual current value dIact is compared with the range of current values stored in memory 52, and if the actual current value is within one of the ranges, the number of solenoids 22 or inductive loads connected in parallel can be determined.

Figure 2A:
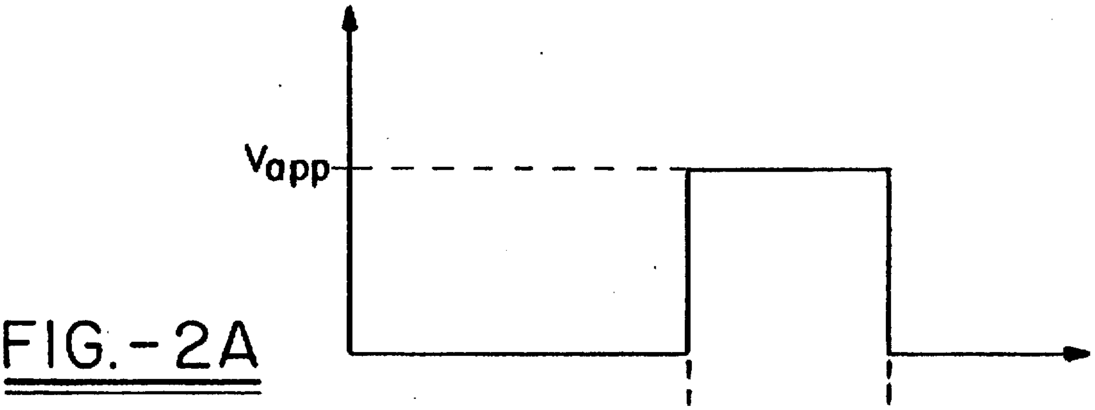
FIG. 2A is a waveform showing the application of a voltage during a predetermined time period dt.
Figure 2B:
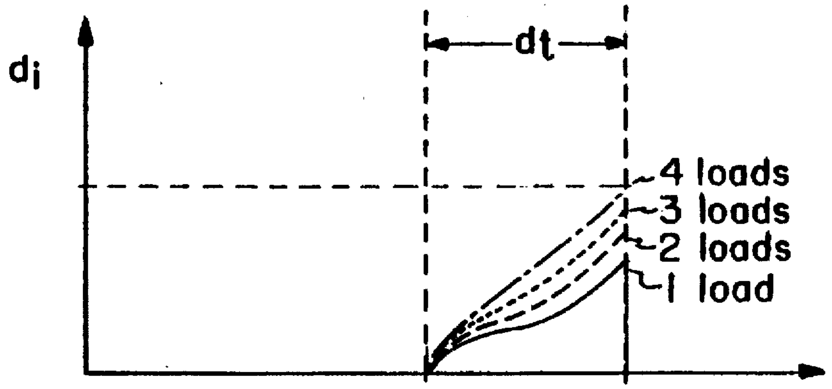
FIG. 2B is a waveform showing a transient current value at the end of the predetermined time period.

Based upon the foregoing equations and with reference to FIGS. 2A and 2B, the micro-controller 20 generates a voltage impulse through generator 38 that momentarily toggles the transistor 40 to an "on" position. The voltage impulse signal (Vapp) is provided for a fixed duration of dt (seconds). At the end of dt, the feedback current 47 (di in FIG. 2B) and the feedback voltage 44 are sensed and received by the initiator 36. The initiator 36 then provides these values to the processor 48 which performs the equations indicated above. The derived actual current value (dIact) is then compared to zero and to the appropriate pairs of reference values stored in memory 52. Each pair of reference values, for each solenoid, provides the worst case positive and negative tolerances for each respective number of solenoids in parallel. When the comparator 50 finds a match, the number of inductive loads/solenoids in parallel is found, stored and communicated by the micro-controller 20 to the input/output device 12. Of course, if no solenoid is connected between the first and second terminals 14 and 16, respectively, no current is developed during the application of the voltage impulse 38, and this information is, accordingly, transmitted to the input/output device 12.

It is apparent then from the above description of the operation of the device 10 for identifying the number of inductive loads connected in parallel that the problems associated with manually setting switches and/or jumpers have been overcome. By reducing possible sources of error during setup or wiring, the likelihood of too much or too little current being applied to the solenoid devices is substantially reduced. If a low current were to be received by a solenoid device, the opening and closure of the movable armature 24 from the orifice 30 would not be acceptable for a high speed assembly operation. In particular, it will be appreciated that the patterns of deposited material would be missing or out of synchronization with the location of the boxes on the assembly line. In a similar manner, an overly high application of current to the solenoids 18 is also prevented. This prevents the solenoids from overheating and becoming damaged and also from damaging any other components within the dispensing gun device.

Yet another advantage of the present invention is that by quickly determining the number of solenoids connected in parallel to the dispensing gun device, the proper calculation for the pull-in currents and holding currents can be quickly obtained based upon the information provided at the input/output device 12. It should also be appreciated that if an actual current value is derived that does not fit within one of the predetermined ranges in memory 52, it is likely that one of the solenoids 18 is not functioning properly. As such, the micro-controller 20 can send an appropriate error message to the input/output device 12 so that the operator can take corrective action.

Thus, it can be seen that the objects of the invention have been satisfied by the structure presented above. It should be apparent to those skilled in the art that the objects of the present invention could be practiced with any number of solenoids or adapted to perform with any size of solenoid.

While the preferred embodiment of the invention has been presented and described in detail, it will be understood that the invention is not limited thereto or thereby. As such, similar configurations may be used in the construction of the invention to meet the various needs of the end user. Accordingly, for an appreciation of the true scope and breadth of the invention, reference should be made to the following claims.

What is claimed is:

1. A device for determining the number of inductive loads connected thereto, comprising:

an input/output unit;

a first terminal and a second terminal adapted to receive any number of inductive loads therebetween, wherein a value of inductance for each inductive load is substantially equivalent; and a computer connected to said input/output unit, wherein said computer determines the number of inductive loads connected between said first and second terminals by applying an initial current and comparing a response of the any number of inductive loads to predetermined responses associated with known numbers of inductive loads.

2. The device according to claim 1, further comprising:

a nominal voltage supply; and a switch connected between said nominal voltage supply and one of said first and second terminals, wherein said switch is closed to determine the number of inductive loads connected between said first and second terminals.

3. The device according to claim 2, wherein said computer senses a feedback voltage applied across the inductive loads and generates a control pulse to close said switch, and wherein said computer senses a feedback current through the inductive loads.

4. The device according to claim 3 wherein said computer factors variations in said nominal voltage supply to correct said measured feedback current to generate an actual current.

5. The device according to claim 4, wherein said computer has a memory for storing predetermined ranges of current values correlating to any number of solenoids connected between said first and second terminals and wherein said computer compares said actual current to said predetermined ranges of current to determine how many inductive loads are connected between said first and second terminals.

6. The device according to claim 5, wherein said computer adjusts a pull-in current and a holding current according to the number of inductive loads between said first and second terminals.

7. A device for quantifying and operating an unknown number of inductive loads connected in parallel, comprising:

a first terminal and a second terminal which have connected therebetween an unknown number of inductive loads;

a computer which controls the magnitude of an operating current supplied to one of said first and second terminals;

a switch connected between one of said first and second terminals and said computer, wherein said switch is momentarily closed to allow said computer to quantify the number of inductive loads connected between said first and second terminals;

a nominal voltage supply connected to said switch wherein said computer generates a control pulse to dose said switch and said computer senses a corresponding feedback current through the inductive loads; and wherein said computer measures and scales said feedback current according to a ratio of said nominal voltage supply and an applied voltage supply provided by said computer to generate an actual current.

8. The device according to claim 7 wherein said computer compares said actual current to a plurality of predetermined ranges of current values correlating to any number of inductive loads connected between said first and second terminals to determine how many inductive loads are connected between said first and second terminals.

9. The device according to claim 8, further comprising:

an output device connected to said computer for visually displaying the number of inductive loads connected between said first and second terminals.

10. The device according to claim 9, wherein said computer adjusts a pull-in current and a holding current according to the number of inductive loads between said first and second terminals.

11. A method for identifying the number of parallel inductive load connected to a dispensing gun driver circuit, comprising the steps of:

providing first and second terminals for connecting any number of parallel inductive loads therebetween;

supplying a nominal voltage to said first and second terminals;

sensing a feedback current generated through the inductive loads;

determining an actual current value by multiplying said feedback current by a correction factor; and comparing said actual current value to a predetermined range of current values to determine the number of parallel inductive loads connected between said first and second terminals to supply the necessary operating current thereto.

12. The method according to claim 11, wherein said predetermined range of current values correspond to the number of inductive loads.

13. The method according to claim 12, wherein said step of determining comprises the steps of:

sensing a feedback voltage generated by the inductive loads; and generating said correction factor by dividing said nominal voltage by said feedback voltage to appropriately scale any variations in the nominal voltage.

14. The method according to claim 13, further comprising the steps of:

storing in a memory device said predetermined range of current values employed by the step of comparing.

15. The method according to claim 14, wherein said step of supplying includes the step of:

providing a switch connected at one end to said nominal voltage and connected at an opposite end to said first terminal, said switch closed by an impulse voltage for a predetermined period of time to generate said feedback current.

16. The method according to claim 15, further comprising the step of:

providing an initiator for actuating said impulse voltage, and collecting feedback voltage value and said current feedback value for use by the step of determining.

* * * * *